United States Patent [19]
Norman

[11] Patent Number: 6,034,891
[45] Date of Patent: Mar. 7, 2000

[54] MULTI-STATE FLASH MEMORY DEFECT MANAGEMENT

[75] Inventor: Robert D. Norman, San Jose, Calif.

[73] Assignee: Micron Technology, Inc., Boise, Id.

[21] Appl. No.: 08/980,528

[22] Filed: Dec. 1, 1997

[51] Int. Cl.$^7$ .................................................. G11C 16/06
[52] U.S. Cl. ................................ 365/185.09; 365/185.11; 365/185.33
[58] Field of Search ........................... 365/200, 189.07, 365/185.03, 185.33, 185.09, 185.11; 395/182.04, 182.05; 371/11.1, 10.1, 10.2

[56] References Cited

U.S. PATENT DOCUMENTS

| | | | |
|---|---|---|---|
| 4,989,181 | 1/1991 | Harada | 365/200 |
| 5,195,057 | 3/1993 | Kasa et al. | 365/200 |
| 5,200,959 | 4/1993 | Gross et al. | 371/21.6 |
| 5,315,552 | 5/1994 | Yoneda | 365/200 |
| 5,418,752 | 5/1995 | Harari et al. | 365/185 |
| 5,469,390 | 11/1995 | Sasaki et al. | 365/200 |
| 5,675,540 | 10/1997 | Roohparvar | 365/185.3 |
| 5,754,567 | 5/1998 | Norman | 365/185.09 |
| 5,758,056 | 5/1998 | Barr | 371/10.2 |
| 5,787,484 | 7/1998 | Norman | 711/159 |
| 5,793,774 | 8/1998 | Usui et al. | 365/201 |
| 5,873,112 | 2/1999 | Norman | 365/185.18 |
| 5,877,986 | 3/1999 | Harari et al. | 365/185.09 |

OTHER PUBLICATIONS

"Compact Flash 4–15 MB", *Flash Memory Data Book*, Micron Quantum Devices, Inc., 3–1:3–4, (1997).
"Flash Memory 2 Meg X 8", *Flash Memory Data Book*, Micron Quantum Devices, Inc., 2–5:2–33, (1997).

*Primary Examiner*—David Nelms
*Assistant Examiner*—Gene N. Auduong
*Attorney, Agent, or Firm*—Schwegman, Lundberg Woessner & Kluth, P.A.

[57] ABSTRACT

A system is described which stores data intended for defective memory cells in a row of a memory array in an overhead location of the memory row. The data is stored in the overhead packet during a write operation, and is read from the overhead packet during a read operation. A defect location table for the row of the memory array is provided to identify when a defective memory cell is address;ed for either a read or write access operation. During a write operation, the correct data is stripped from incoming data for storing into the overhead packet. During a read operation, the correct data is inserted into an output data stream from the overhead packet. Data written to defective cells can be either a custom setting, a default setting, or the original data. Shift registers are described for holding good data during either a read or write operation. The number of shift registers used is determined by the number of states stored in a memory cell. The shift registers use a marker for alignment ofdata bits in a data stream.

51 Claims, 11 Drawing Sheets

MULTI-STATE FLASH MEMORY DEFECT MANAGEMENT

TECHNICAL FIELD OF THE INVENTION

The present invention relates generally to memory devices and in particular the present invention relates to defect management in a multi-state memory device.

BACKGROUND OF THE INVENTION

Typically, computer systems store data on a magnetic medium such as a hard disk drive. The hard disk drive is an electro-mechanical component of the computer system that operates by storing polarities on magnetic material which can be rewritten quickly and as often as desired. A typical hard drive includes at least two moving parts that respond to control signals generated by a processor of the computer system. Conventionally, a hard disk drive includes a disk that is formed from an aluminum substrate that is rotatably mounted to a base. A magnetic material is deposited on a surface of the substrate. A rotatable actuator arm moves a ceramic transducer over the surface of the disk to read data from and write data to the hard disk. These mechanical parts are more delicate and less reliable than the other, solid state, components of the computer system. However, magnetic hard disk systems have dominated storage media for computers and related systems due to the low cost per bit of data and high density storage capacity of available magnetic hard disk systems when compared to conventional solid state alternatives.

Solid state memory devices store data in storage locations, referred to as "cells." Conventional designs only allow a single bit of data to be stored at a given time in each cell. Typically, a cell includes an access transistor and a storage element such as a capacitor or a floating gate that stores data based on the electric charge on the storage element. The electric charge in conventional applications represents either a binary "1" or "0" and thus conventional designs require a single transistor for each bit of data. The storage density for solid state memories is limited by the ability of designers to pack transistors on a semiconductor substrate. Although transistors can be packed more tightly together with each succeeding generation of design technology, this density does not compare well with the storage density of a magnetic medium.

Recently, designers have attempted to increase the storage density of flash memory cells by creating a memory cell that is capable of storing more than one data bit referred to as "multi-state" flash memory cells. In a conventional flash memory, charge is stored on a floating gate of a field-effect transistor in response to a signal applied to a control gate. The charge on the floating gate represents either a binary "1" or "0" based on the effect the charge has on the current through the transistor. Initially, the floating gate is not charged, which represents a binary "1." When a binary "0" is stored, electrons are forced to the floating gate by a sufficient voltage on the control gate to induce hot electron injection which reduces the drain current of the transistor. Thus, by sensing the drain current of the transistor, the value of the data bit stored by the flash memory cell can be determined.

To increase the number of states that can be stored in a memory cell, designers have attempted to use adjustments to the threshold voltage of the transistor. This technique has been shown to store two to four bits of data in a single cell. To store additional states, complex programming techniques to adjust the threshold voltage of the transistors during each read and write operation must be used.

Memory devices, regardless of the states stored, experience defects. These defects can be a result of manufacturing or latent defects due to operation. Eliminating defects is not economically feasible.

For the reasons stated above, and for other reasons stated below which will become apparent to those skilled in the art upon reading and understanding the present specification, there is a need in the art for defect management in a multi-state memory.

SUMMARY OF THE INVENTION

The above mentioned problems with defect management and other problems are addressed by the present invention and which will be understood by reading and studying the following specification. A method is described which reroutes data from defective memory locations and stores the data in an overhead location in a memory row.

A processing system comprising flash memory devices having an array of memory cells arranged in rows and columns, each row of the array includes memory cells formatted to storing overhead data. The system comprises a processor for controlling read and write operations to the flash memory devices, a defect table register for storing a defect table identifying addresses of defective memory cells in the flash memory devices , and a compare circuit for comparing the defect table and an address of the memory location of one of the plurality of flash memory devices to determine if the memory location is defective. At least one shift register is included for serially holding input data intended to be written to defective memory locations, and memory interface logic is provided for storing contents of the at least one shift register to the memory cells formatted to storing overhead data.

In another embodiment, a method is described for storing data in a flash memory device comprising an array of memory cells arranged in rows and columns, each row of the array having a data portion for storing data, and an overhead portion. The method comprises the steps of identifying defective memory cells located in the data portion of a row, receiving a stream of data bits to be stored in the array of memory cells, selectively removing data bits from the data stream which are intended to be written to the defective memory cells, and serially storing the removed data in the overhead portion of the row.

A method of storing and retrieving data in a memory device is described. The method comprises the steps of receiving an input serial stream of data bits, storing the input serial stream of data bits in a data location of the memory device wherein at least two of the data bits are stored in one memory cell, and selectively copying data bits from the input serial stream of data bits and storing the copied data bits in an overhead location of the memory device. The method also includes the steps of reading an output serial stream of data bits stored in the data location of the memory device, reading the copied data bits from the overhead location of the memory device, and selectively replacing data bits in the output serial stream of data bits to recreate the received input serial stream of data bits.

In yet another embodiment, a method is described for storing data in a memory device. The method comprises the steps of comparing a table of known defective memory cell locations to a current access target location of the memory, extracting data bits from a plurality of data bits which are to be stored at the current access target location of the memory, substituting alternate data bits for the extracting data bits, storing the plurality of data bits including the substituted alternate data bits at the current access target location, and storing the extracting data bits in the memory at a second location.

A data management system is described which comprises a controller for accessing memory locations in response to externally provided commands, a defect table register for storing a defect table having a plurality of memory addresses of defective memory locations, and a comparator for comparing addresses stored in the defect table to currently accessed memory addresses. The system also comprises a plurality of shift registers for holding data directed to defective memory locations, and substitution circuitry for selectively substituting data in place of the data stored in the shift registers.

Another embodiment of the present invention also provides a processing system comprising a plurality of multi-state flash memory devices having an array of memory cells arranged in rows and columns, each row of the array includes memory cells dedicated to storing overhead data, and a processor for controlling read and write operations to the plurality of multi-state flash memory devices. The processing system further comprises a defect table register for storing a defect table identifying addresses of defective memory cells in the plurality of multi-state flash memory devices and replacement data, a compare circuit for comparing the addresses of the defect table and an address of the memory location of one of the plurality of multi-state flash memory devices to determine if the memory location is defective, and two shift registers for serially holding input data intended to be written to defective memory locations. Substitution circuitry is provided for substituting the replacement data from the defect table in place of the input data intended to be written to defective memory locations prior to writing the input data to one of the multi-state flash memory devices. Memory interface logic stores contents of the at least one shift register to the memory cells dedicated to storing overhead data.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

In a Flash memory system optimized for mass storage, a controller that globally manages defects within the Flash memory devices of the system can reduce overall system cost. The cost reduction is realized because remapping hardware is removed from each memory device and implemented once in the controller. In addition to this initial cost savings, the controller can correct latent defects encountered during field usage. Thus, the ability to remap data bits provides a more robust system with greater reliability. The defect management system is described in detail following a brief description of the basic components and operation of the Flash memory.

Flash Memory

Figure 1A:
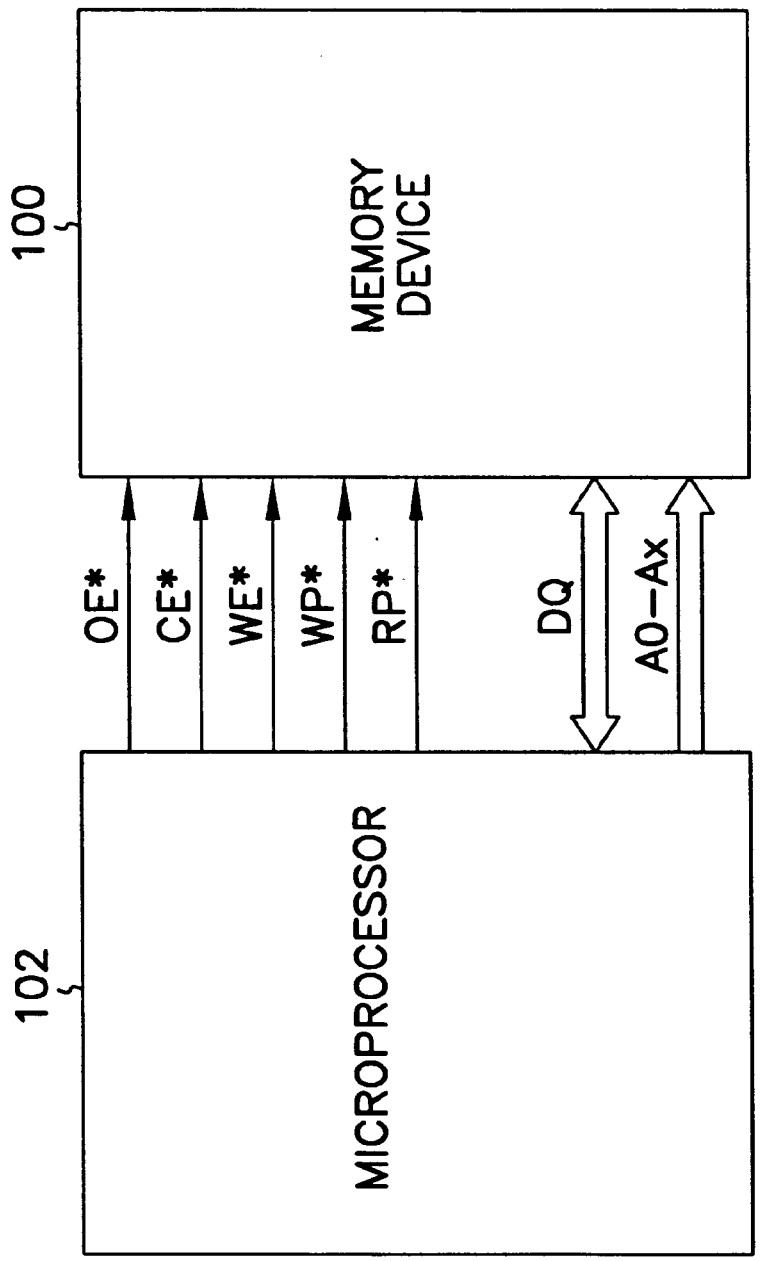
FIG. 1A is a block diagram of a flash memory incorporating the present invention.
Figure 1B:
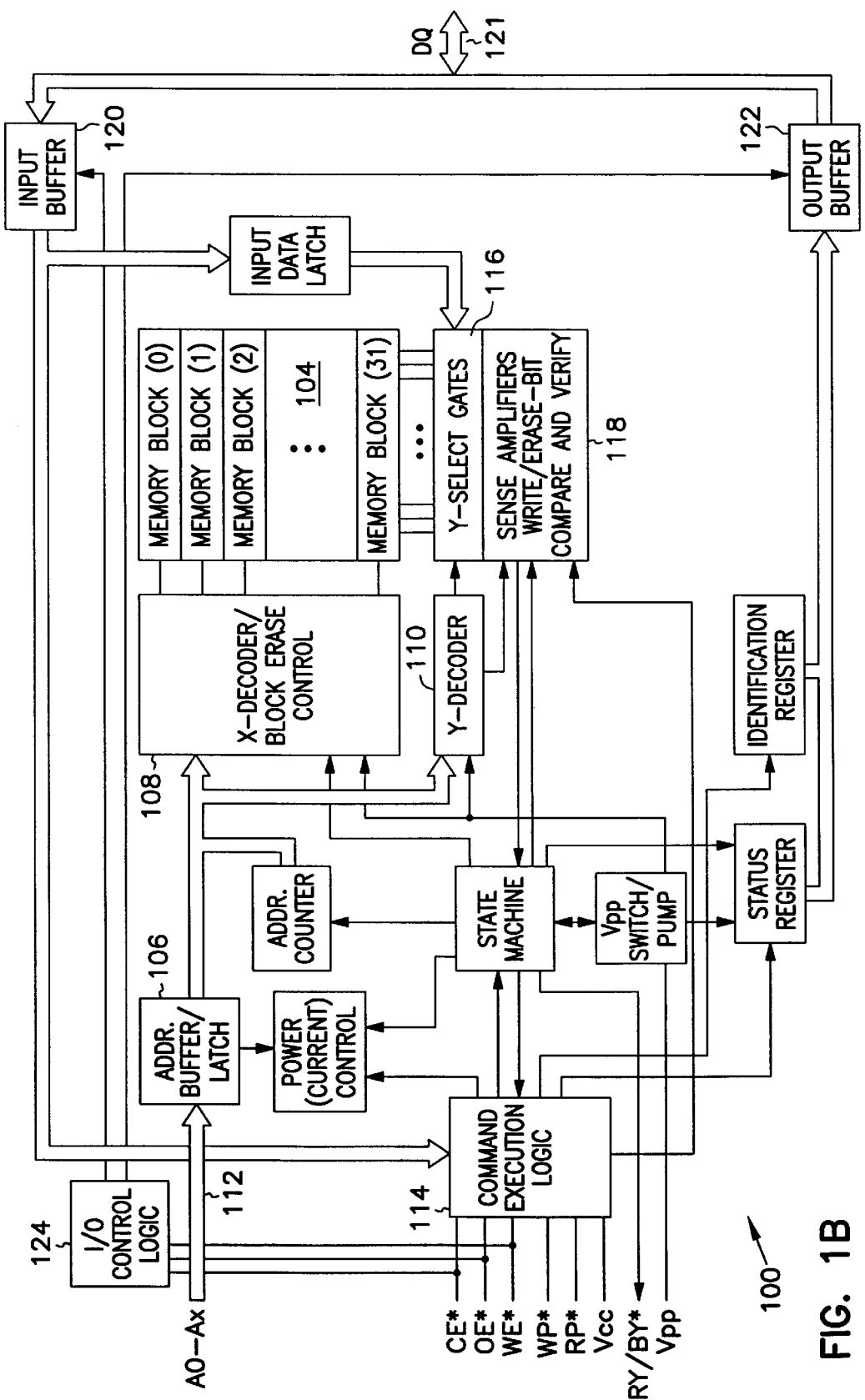
FIG. 1B is a more detailed illustration of the memory of FIG. 1A.

FIG. 1A illustrates a block diagram of a Flash memory device 100 which is coupled to a flash controller 102. The memory device has been simplified to focus on features of the memory which are helpful in understanding the present invention. The memory device 100 includes an array of memory cells 104, FIG. 1B. The memory cells are preferably floating gate memory cells. The array is arranged in rows and columns, with the rows arranged in blocks. The blocks allow memory cells to be erased in large groups. Data, however, is stored in the memory array individually or in small data groups (byte or group of bytes) and separate from the block structure. Erase operations are performed on a large number of cells in parallel.

An x-decoder 108 and a y-decoder 110 are provided to decode address signals provided on address lines A0–Ax 112. Address signals are received and decoded to access the memory array 104. An address buffer circuit 106 is provided to latch the address signals. A y-select circuit 116 is provided to select a column of the array identified with the y-decoder 110. Sense amplifier and compare circuitry 118 is used to sense data stored in the memory cells and verify the accuracy of stored data. Data input 120 and output 122 buffer circuits are included for bidirectional data communication over a plurality of data (DQ) lines with the microprocessor 102. Command control circuit 114 decodes signals provided on control lines from the microprocessor. These signals are used to control the operations of the memory, including data read, data write, and erase operations. Input/output control circuit 124 is used to control the input and output buffers in response to some of the control signals.

The mass storage Flash is designed to store multiple bytes of data at one time. These groupings of bytes are referred to as packets of data. Each packet of data is preferred to be 32 bytes in length (256 Bits), but could be 64, 128 or more bytes long. Each row of the memory is designed and formatted to store a sector of data plus overhead bits. In one embodiment, a memory has rows containing 17 packets. Of these packets, 16 are for user data and one is for overhead bits such as ECC. The data in a packet is addressed in the memory sequentially where it starts at address 0000 and goes for 32 bytes and then advances to the next packet. Thus, a packet boundary is crossed every 32 bytes. In a 10-bit flash memory address, the lower 5 bits identify the byte number from 00 to 1F, and the other 5 bits identify the packet from 00 to 10, as illustrated in Table 1. By counting sequentially, first by byte, then by packet, a full row of Flash information can be accessed.

TABLE 1

| P4 | P3 | P2 | P1 | P0 | B4 | B3 | B2 | B1 | B0 | |
|---|---|---|---|---|---|---|---|---|---|---|
| 0 | 0 | 0 | 0 | 0 | 0 | 0 | 0 | 0 | 0 | Packet 0 Byte 0 |
| 0 | 0 | 0 | 0 | 0 | 1 | 1 | 1 | 1 | 1 | Packet 0 Byte 31 |
| 0 | 0 | 0 | 0 | 1 | 0 | 0 | 0 | 0 | 0 | Packet 1 Byte 0 |
| . | . | . | . | . | . | . | . | . | . | |
| 1 | 0 | 0 | 0 | 1 | 1 | 1 | 1 | 1 | 1 | Packet 17(1)) Byte 31-end of row |

As stated above, the Flash memory of FIG. 1A has been simplified to facilitate a basic understanding of the features of the memory. A more detailed understanding of Flash memories is known to those skilled in the art. See "1997 Flash Memory Data Book" pages 2–5 to 2–33 available from Micron Quantum Devices, Inc. (incorporated herein by reference) for a more detailed description of a Flash memory.

Figure 1C:
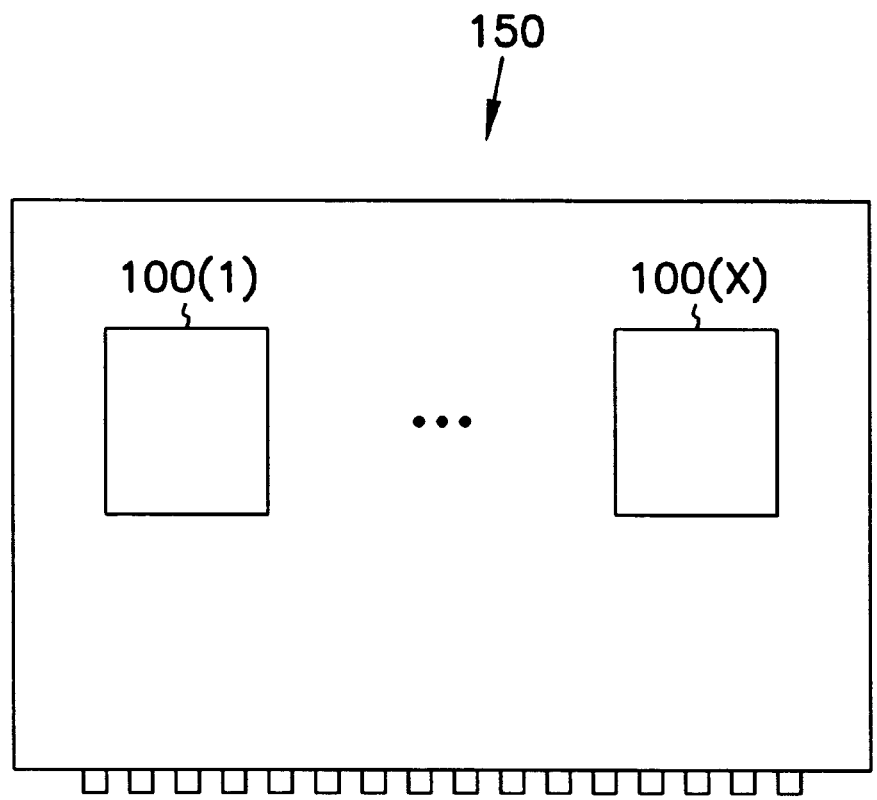
FIG. 1C illustrates a Flash memory card including the memory of FIG. 1A.

It will be appreciated that more than one Flash memory can be included in various package configurations. For example, Flash memory cards 150 can be manufactured in varying densities using numerous Flash memories 100(1) –100(x) as illustrated in FIG. 1C. See "1997 Flash Memory Data Book" pages 3–1 to 3–3 available from Micron Quantum Devices, Inc. (incorporated herein by reference) for a more detailed description of a Flash memory card.

There are numerous ways to handle defects in a Flash memory device. A simple method is detailed in patent U.S. Pat. No. 5,200,959 entitled "Device and Method for Defect Handling in Semi-Conductor Memory," and incorporated herein by reference. This method skips defective locations by serially shifting stored data one or more locations to a non-defective cell. While this method is effective, a problem arises when defect management is done on multi-state memory devices. In such designs, the storing of bad bits requires bit storing differences and knowledge of the number of defects present. Key problems of such a design are:

1) Capture of the data bits to be stored at a known bad location;
2) Efficiently adjusting these bits for storage, allowing for fast readback;
3) Storing the good data bits in a special format, for later retrieval; and
4) Reading these bits and replacing the bit grouping if bad locations are detected.

These problems can be addressed using either hardware, or software with assistance from special hardware. Both embodiments for defect management are provided in the following descriptions.

Defect Management of a Multi-State Flash System

To manage defects in a flash system, data intended to be written to a memory location must be stored in an alternate location. Typically this is accomplished by storing the data in a redundant location which is specifically designated to replace the defective memory cells. When the memory is a multi-state memory, the data which must be saved to an alternate location is increased for each defective memory cell. The present invention stores data intended for defective memory cells in a row of the memory array in the overhead packet of the memory row. The data is stored serially in the overhead packet during a write operation, and is read serially from the overhead packet during a read operation. A defect location table for the row of the memory array is used to identify when a defective memory cell is addressed for either a read or write access operation. At this point during either access operation, the correct data is either stripped from incoming data for storing into the overhead packet, or is inserted into an output data stream from the overhead packet. To provide flexibility in reducing effects of defective memory cells, data written to defective cells can be manipulated to a specific state. That is, a memory cell which has a short circuit may be written to an erase state to reduce current during the writing operation, while a different type of defect may require a different storage state. A default setting, or the original data can also be used if the specific defect is not known or does not matter. The flash write and read operations are described below in detail with reference to the components of the system.

Flash Write

The hardware for implementing defect management is explained herein by using four-state storage (2 bits per cell) as the example. Other differing state storage designs can be designated using this approach with modifications to adjust for the differing bits per cell. The defect management method taught by this example is for managing bad bits and bad column locations within a given row (sector) of a Flash memory chip. Some systems may be designed that stop using a row when a particular defect is found, however to be cost effective, systems using Flash as their mass storage device require error management of these type of defects.

Figure 2:
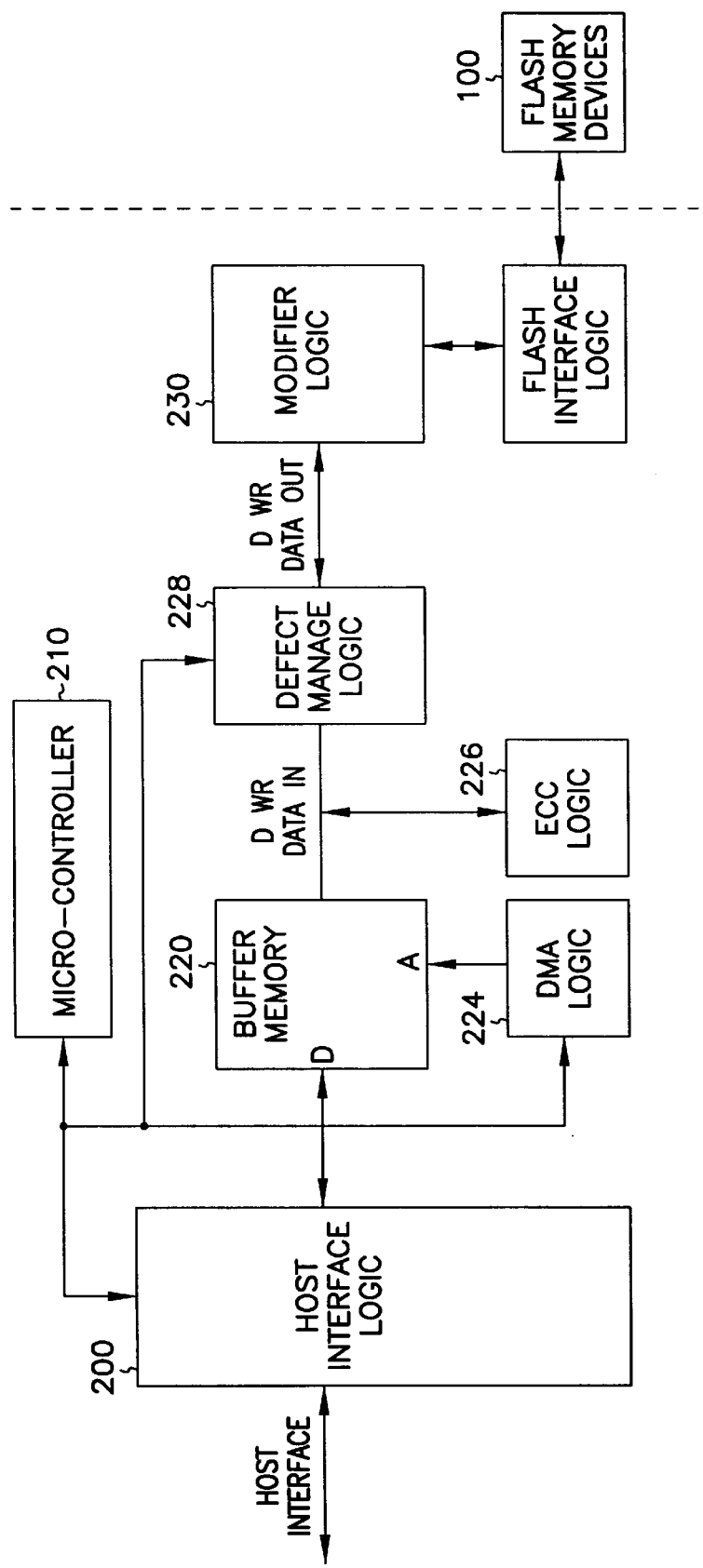
FIG. 2 is a block diagram of a processing system having defect management.

FIG. 2 shows the write data path sending a sector of data to Flash 100. A Flash system emulating a disk drive has a host interface logic 200 that is compatible with standard disk drive interfaces. In such a system the host interface logic is typically an IDE, SCSI or PCMCIA-ATA interface logic design. Each of these interfaces communicates with the controller 210 and handshake commands and data according to their specific protocols. In each case the data desired to be read or stored to or from flash is stored in a temporary holding buffer 220. This buffer holds one or more sectors of file data, where a sector is typically designated as a 512 byte block of user data (16 data packets).

On writes to flash, the host (not shown) sends a command, via the interface logic 200, to the controller 210. This command contains the location that the file is to be stored and how many sectors of data are to be stored. After sending the controller this command information, the sector data is sent to the controller. The write data is stored in the temporary holding buffer 220. The controller issues a command to the flash, setting it up to receive the data from the buffer. The controller then activates direct memory access (DMA) hardware 224 to move this data from buffer memory to Flash. Once a sector has been received by the flash, the controller writes this information to a location determined by file management software within the controller. While data is being sent to the Flash memory several things can occur to the data being gated to the Flash memory.

As the data is gated from buffer memory to flash, the data can be input to the ECC logic 226 to calculate the check bits to be stored with the data. In addition to this operation, the data passes through a block of logic 228 that captures the data bits for the known bad bit locations. Another block of logic that the data may pass through is Modifier logic 230 which may alter the data prior to writing the flash.

To make the defect management hardware 228 functional, the flash system finds the known bad bit and column locations and builds a data table, or register, containing the addresses of these defects. This defect table is loadable from the controller 210 into the defect management logic 228. The information stored in the defect management logic, therefore, contains address locations of known bad locations for the array area of the flash about to be accessed by a write operation. In addition to the defect table, the defect management logic contains a working address pointer that indicates the address location of data being sent to memory. The defect management logic compares the defect table with the working address pointer. When the two addresses are equal, a compare flag is activated to indicate that the data is being sent to a bad location and will be lost unless it is saved to another know good location. The compare flag alerts the hardware to this condition and generates a timing signal that loads the good data into a shifter register (or FIFO), capturing the good data bits which were to be written to the bad memory cell locations. Once a bad bit location is detected, the address pointer in the defect table is incremented to the next defective memory address location. Another comparison between the table pointer and working address is made and if they are equal, the corresponding good data is again loaded into the shift register. When no more compares are made, the controller sends the data to the Flash and generates a strobe that writes the data into the flash. While the good data bits intended for bad locations are saved in the shift register, a parallel substitution can be performed on the data bits to be written to Flash to substitute data written to the defective locations.

Figure 3:
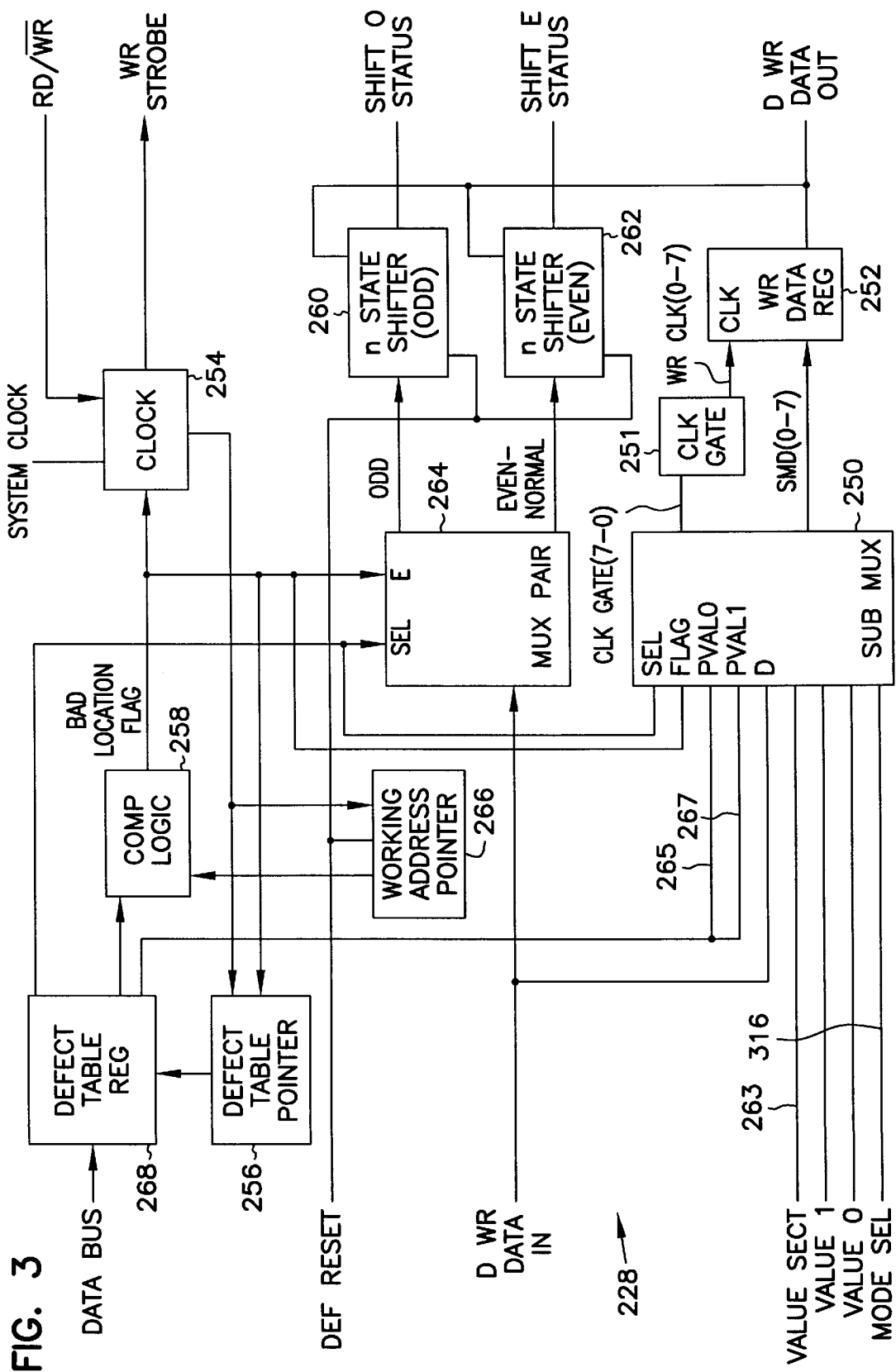
FIG. 3 is a block diagram of defect management logic.

Referring to FIG. 3, a more detailed description of the defect management logic 228 is provided. A substitute multiplex circuit 250 and latch 252 at the output of the multiplex are used to alter, or substitute, the data to be written to the bad bit locations. This hardware can be used to multiplex a substitute bit value(s) to the target location, such as an erase state value to reduce programming current. While the erase state may be the most typical value stored to defective locations, all states are possible by the using a Value Select line 263, explained in more detail below. Three options are available, the first is to write the input data without substitution, the second is to use a common substitution value for all defect locations, and the third is a custom value for each defect location depending upon the type of defect encountered.

If data is to be written to flash without substitution, data provided on the Data In lines are coupled through multiplex circuit 250. To use a common substitution value, Value Select line 263 is activated by the controller and the 2-bit data values provided on Value_1 and Value_2 lines are substituted for good data provided on the Data In lines. For custom substitution values, the controller can set the substitute value by setting the bits for the cell (2 bits for this example) using PVal_0 265 and PVal_1 267 lines. In this method, the controller provides data values which are contained in the defect table. Each defect table entry contains corresponding replacement bit settings to be loaded into the data register 252 for the bad location that it represents. By having each defect table entry of the table contain replacement value(s), full flexibility in the loading of defective data bits is possible.

The data register 252 is clocked with individual clocks for each of the bits representing a data cell storage. The clock 254, defect table 256 and compare logic 258 work together to generate the necessary signals to load shift registers 260 and 262 and the write data register 252 with desired values. One timing relationship for the elements of defect management logic 228 is shown in the timing diagram of FIG. 4.

Figure 4:
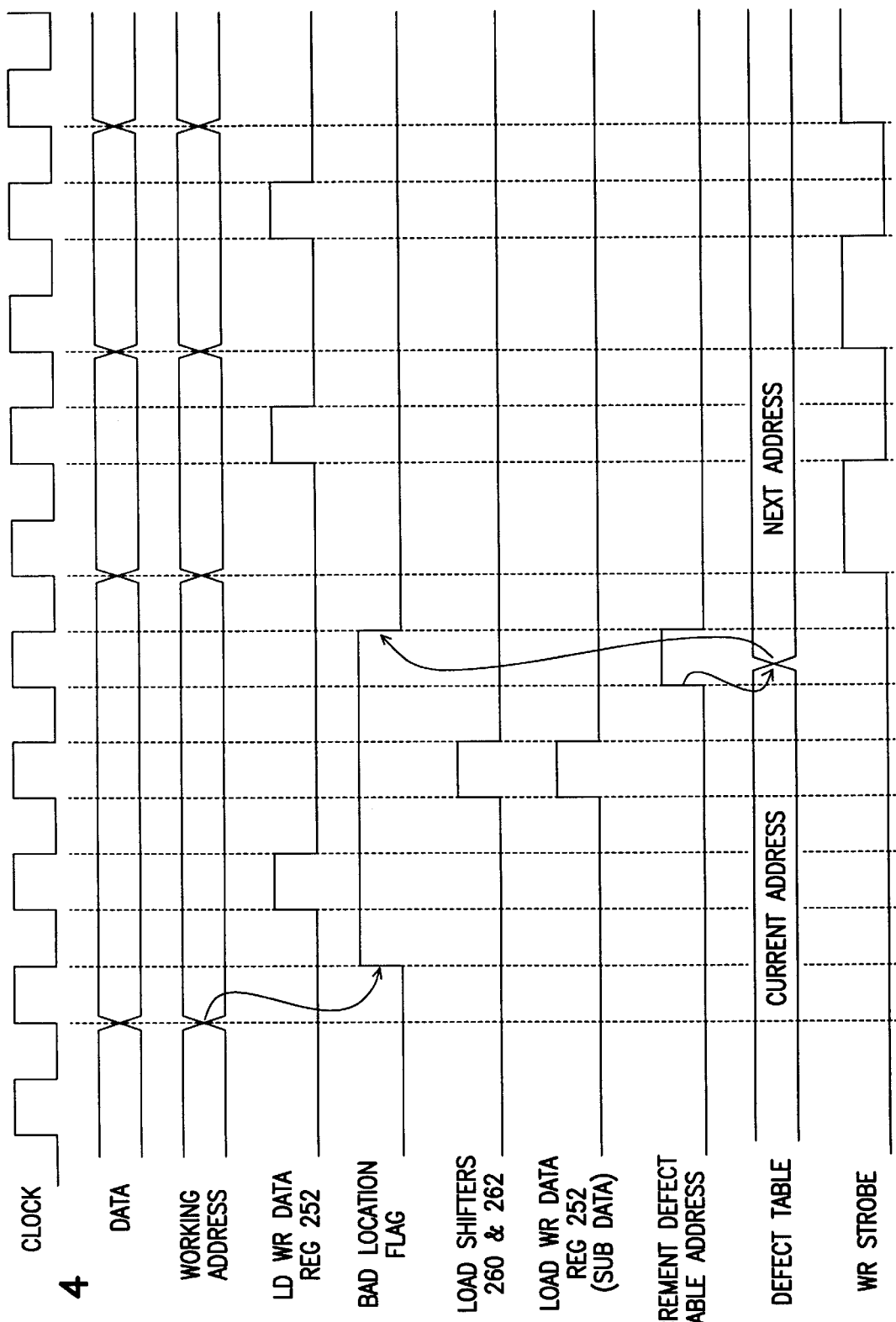
FIG. 4 is a timing diagram of the operation of the logic of FIG. 3.

Referring to FIG. 4, the basic write operation is described. The flash memory is a synchronous device operating in accordance with a system clock. During the write operation, data is received on the input data lines and an address is received from the controller on address input lines. A portion of this address is loaded into working address register 266 for comparison to the defect pointer address. As explained above, the defect pointer address is loaded into defect table register 256. Again, the defect pointer address is retrieved from the controller or memory when an external address is received indicating a location of the memory which is to be accessed. The working address and the defect pointer address are compared. If a match is determined the bad location flag signal will transition to an active high state. The write data register signal (Wr Data In), connected to multiplexers 264 and 250 as shown in FIG. 3, is activated for loading the multiplexers with the input data. Shift registers 260 and 262 are then activated by a Load Shifters signal. If substitute data is to be loaded into the flash memory, the alternate data is loaded into the multiplex circuits prior to loading the shift registers. The substitute data can be encoded for n-bit data storage. For example, the substitute data can be two bits for a 4-state memory cell. Once the shift registers have received the input data, or the substitute data, the defect table pointer is incremented to the next defective address. The bad location flag is reset, and a new working address is compared to the incremented defect table address. When all the received data is processed, a write data strobe signal is used to write received data to the flash memory, including the overhead data.

Because data is provided to the memory as a byte of data (8-bits), but is stored in only four flash memory cells, two bits of incoming data are directed to each memory location. To reduce the size of the defect table, the defect table is loaded with an address of the least significant bit of a cells data value to be programmed. For example, bits 0 & 1, 2 & 3, 4 & 5, 6 & 7 are paired for storing four-state data into the memory. That is, two bits are encoded and stored in one memory cell. If a cell is found bad due to manufacturing defects, a bad bit (cell) pointer is generated and stored in a table. Only one pointer is needed to be generated for each cell. It was decided that the least significant bit would be the bit of the pair pointed to for defects. For example, if the cell being written to by bit pairs 4 and 5 was defective, the pointer for that pair would point to bit 4 as being bad. The hardware in the defect logic 228 recognizes this and knows to also action bit 5 at the same time. This dual bit operation is clone for the saving of the bad bits as well as the substitution of write data bits at bad locations.

To further understand the function of the defect pointers and the compare logic, the bit usage of the defect table entries are explained in greater detail. The controller assigns addresses to the defect pointers to indicate which bit of a byte is defective, which byte of a packet is defective and which packet it is located in. In addition to the addressing information, write bits for substituting into the defective locations are attached to the defect table entry. The bad bit locations (D0–D2) in the defect pointer address are not used for compare an address, but instead are used for the multiplexer selection in locating the LSB bit in the input data. The working address register 266 contains data to count the bytes and packets for comparing to the pointer values. The defect pointer address is assigned the following bit usage:

| | |
|---|---|
| D0 | Bit Decode 0 |
| D1 | Bit Decode 1 |
| D2 | Bit Decode 2 |
| D3 | Byte A0 |
| D4 | Byte A1 |
| D5 | Byte A2 |
| D6 | Byte A3 |
| D7 | Byte A4 |
| D8 | Byte A5 |
| D9 | Packet A0 |
| D10 | Packet A1 |
| D11 | Packet A2 |
| D12 | Packet A3 |
| D13 | Packet A4 |
| D14 | Bad Bit Even |
| D15 | Bad Bit Odd |

Bits D3–D8 are used to decode the Byte within the Picket, and D9–D13 are used to decode the Packet address. Bits D14 and D15 are used to substitute custom data values to the defective memory location, as described above. Bit D8, or Byte address A5, is only used in multi-state mode as the number of bytes within a packet are doubled to four states per cell instead of two states.

Figure 5:
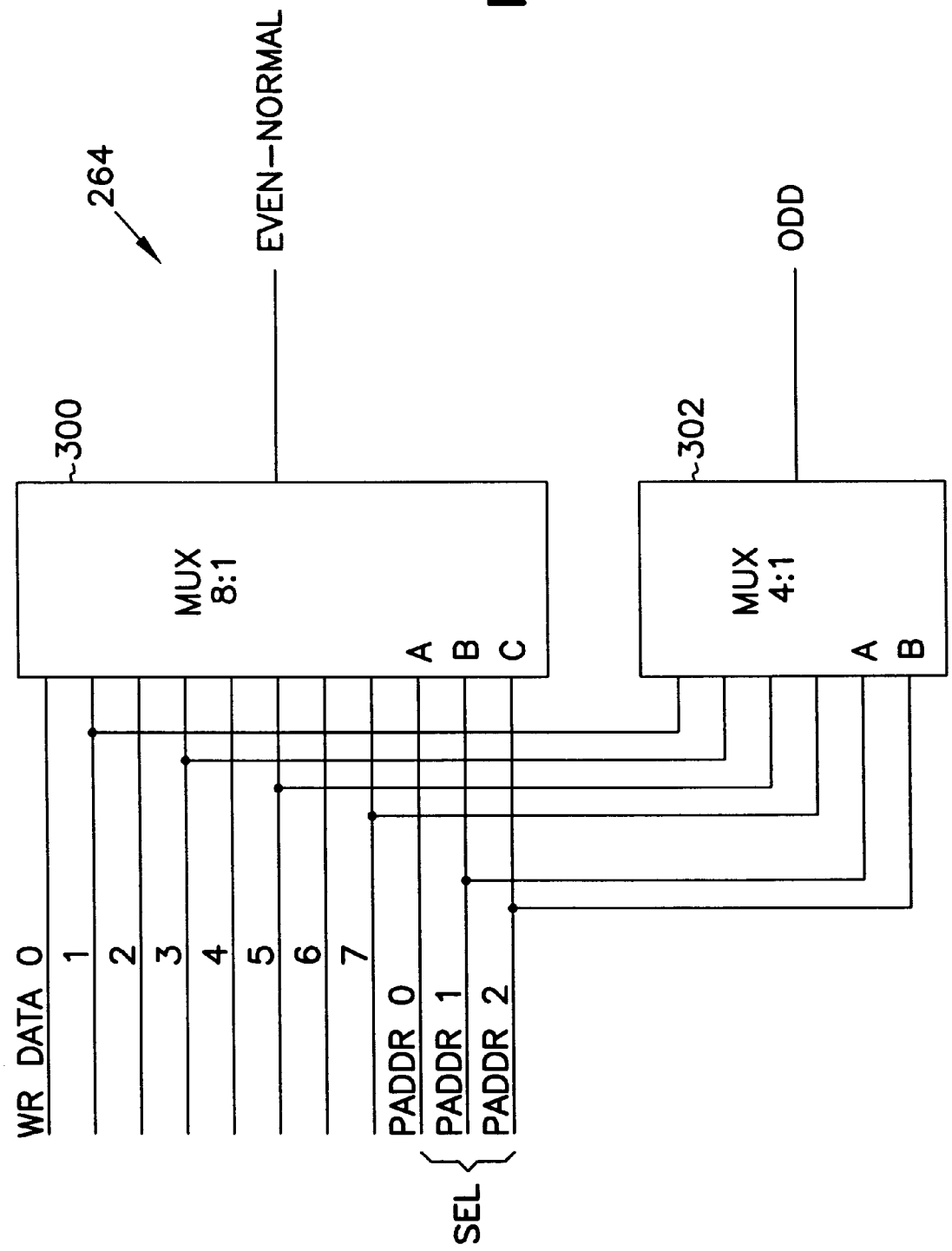
FIG. 5 illustrates a multiplex circuit included in FIG. 3.

FIG. 5 shows one way of separating the bit pairs for storage in Flash. The multiplex circuit pair 264 of FIG. 2 is illustrated in greater detail in FIG. 5. By pointing to an even bit using bad bit pointers on inputs A, B, & C of the 8 to 1 mux 300, the appropriate even write data bit is output by the mux and gated to the shifter 260. Inputs A, B, & C are coupled to receive bits D0–D2 of the defect pointer. The corresponding bit for the even bit pair is addressed using inputs A & B of the 4 to 1 mux 302, allowing for the proper odd bit to be stored in parallel shifter 262. It can be seen that the full data word is present on the inputs of the mux and can be selectively coupled to the output of the mux for inputting to the shifters. By allowing full selection of bits in a word, the controller is able to support 2 modes of Flash storage; multi-state, as described, as well as the traditional two-state storage. By building a controller that supports the gathering of bits according to the number of states that the Flash is operating, while allowing for full bit selection, the controller can support various types of flash. Using firmware, the same controller can switch between different numbers of states being written on a given memory or combination of memories. Further, the ability to store any bit in the shifters allows the controller to store single bits pointed to as bad in two-state storage, yet switch and store only even sits for four-state storage, or other higher state storage.

Figure 6:
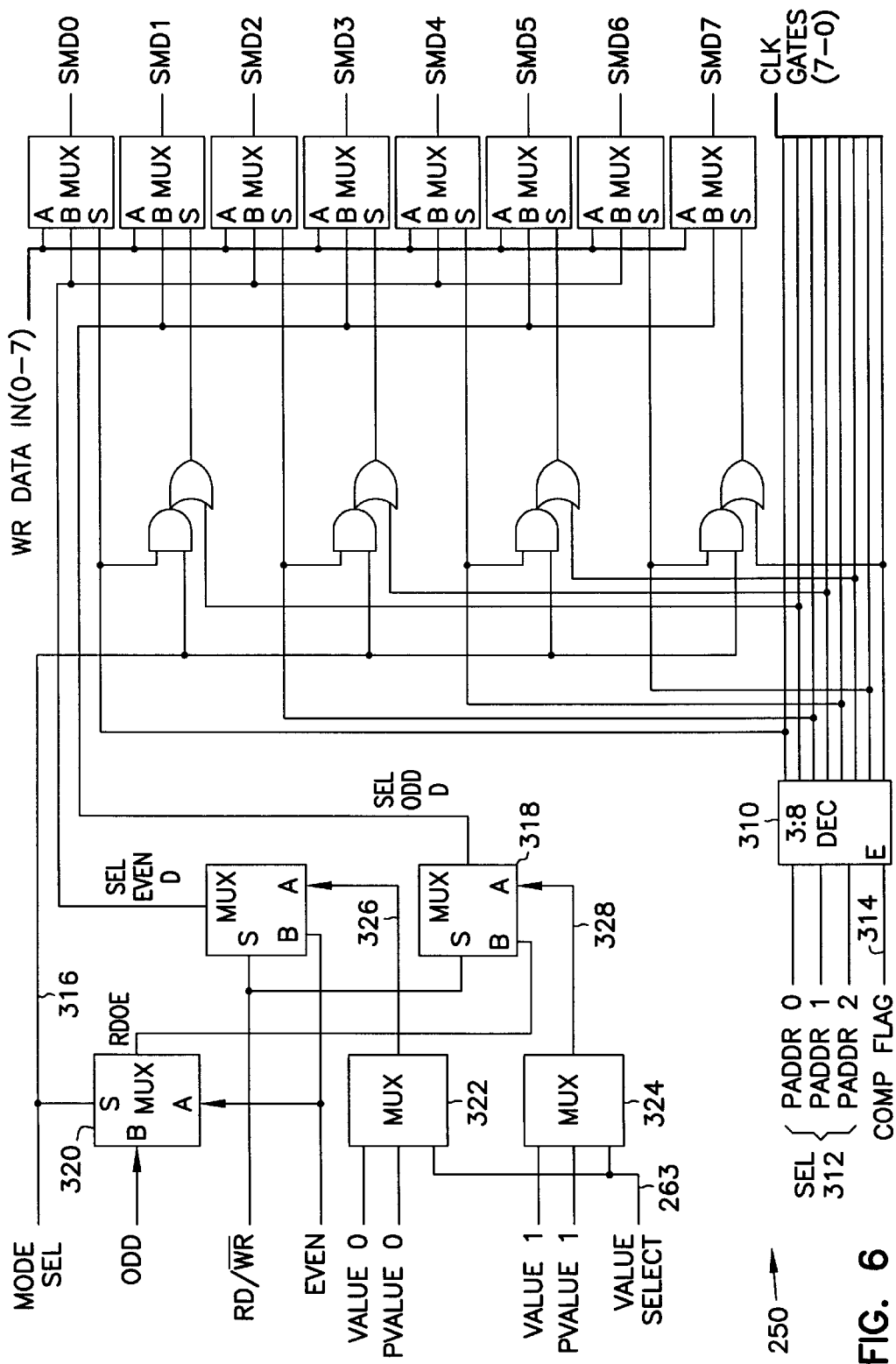
FIG. 6 illustrates a substitute multiplex circuit included in FIG. 3.

As described above, good data can be substituted prior to writing to a defective location. FIG. 6 shows the substitution multiplex logic 250 for writing a known value to a defective location, such as an erased state. The pointer bits 312 along with an enable 314 from the compare flag logic 258 enables a decoder 310 to activate a corresponding line (0–7) for changing the bit(s) for the bad location. An active mode select line 316 selects alternate data for gating to the write register 252, in place of the original data intended for writing. If the mode signal is active (indicating four-state storage) then an active line on one of the even bits also activates the corresponding Odd Bits Mux 318 select line output. The selecting of the odd bit, in conjunction with an even bit select, allows for selection of bit pairs to be loaded into the write register. Thus, cell data can be updated as desired. When multiplexer 320 select line is activated, the alternate, or substitute, data path is selected. As stated above, the alternate data path is selectable from one of two sources.

The controller can set Value0 and Value 1 by loading the corresponding values in holding registers 322 and 324 that drive lines 326 and 328. The other source is bits stored as part of the defect table 268. Two pointer bits (Pvalue_0, Pvalue_1) representing the defect value corresponding to the defect location are the optional other substitution values. Which substitution pair is selected is determined by another control line activated by the controller called the Value Select 263 line. This line activates the pair of 2 bit multiplexers 322 and 324 which select either the controller pair or the defect table pointer pair as the source for the substitution. If the controller path is selected, a fixed value (of substitution for defects will be gated to the write data register. On the other hand, if the defect table bits are selected, the substitution value used can be altered as each new substitution pair is selected. This allows each defect to alter the write data according to the state desired.

Figure 7:
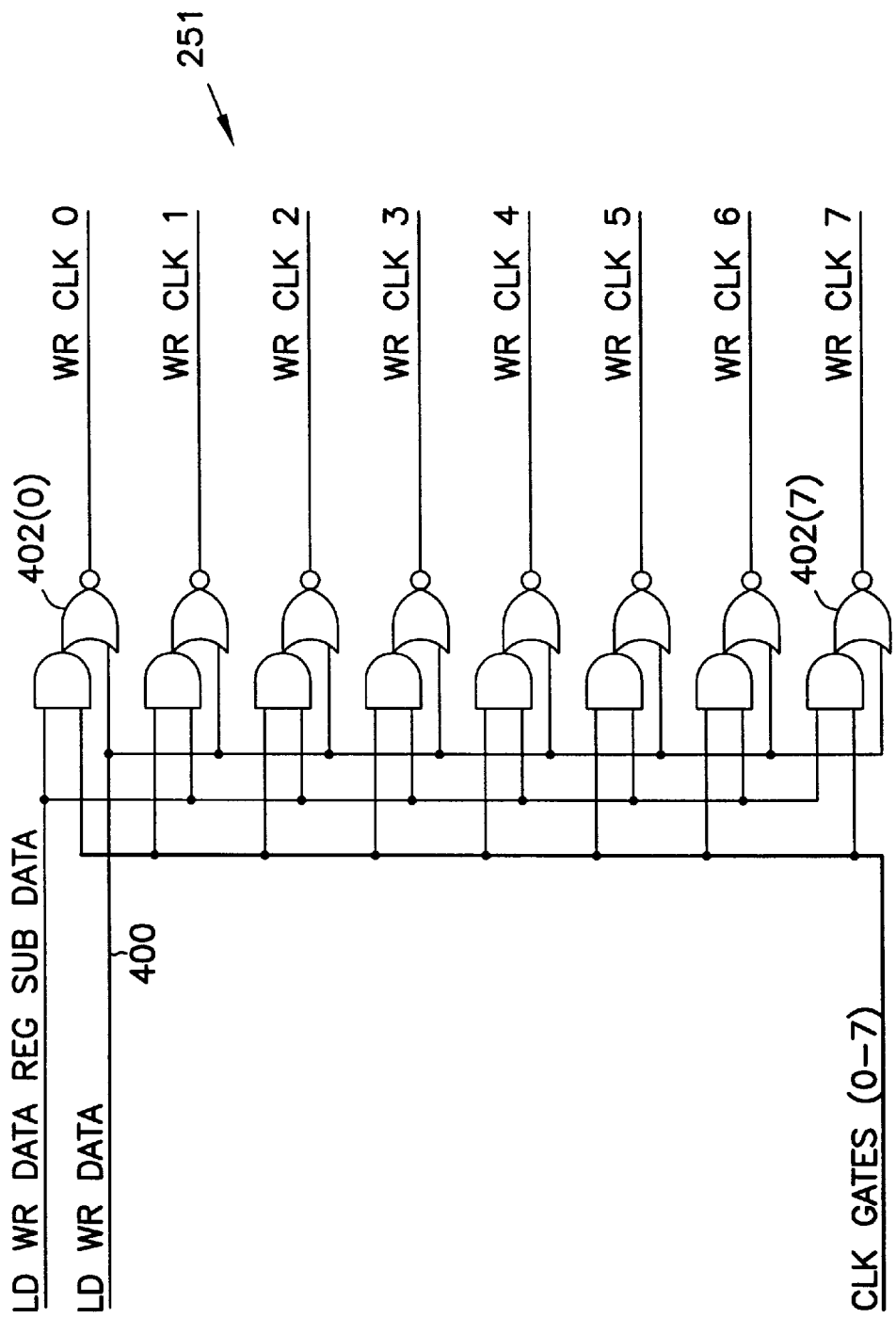
FIG. 7 illustrates a clock circuit included in FIG. 3.

FIG. 7 shows the clock logic 251 of FIG. 3 for loading the write data register 252. A general signal entitled Ld Wr Data 400 goes to all the OR gates 402(0)–(7) of the clock gating logic. When Ld Wr Data pulses high, all the data bits on the write data register inputs are loaded into 8 individual write data registers by the 8 clock signals entitled "Wrclk(0–7)". If a bad bit location is detected (active bad location flag), the select logic from sub mux logic 250 enables the bit locations. Likewise, if the multi-state mode is active by the mode select line being set, then pairs of enable signals are activated for each of the pointer addresses representing the LSB bit in error. The timing logic generates a pulse for gating the substitute data (SMD0–7) into the write data register 252. The occurrence of the special write pulse in conjunction with the proper clock gates allow the appropriate clock logic to toggle at the proper bit locations loading the substitute data as desired. At the same time, the good bit locations remain unaltered from the general load that preceded the special load pulse. Again, one clock or two clocks will be generated depending on the activation of the mode bit. This selective gating of 1 or 2 clocks allows the logic to support both two-state and four-state data control. It should be noted that the present invention can easily be extended to 8 state, 16 state up to any desired range of multi-state storage. The difference being the extension of the circuitry to allow 3, 4 or more bits and clocks to be updated. In an n-bit memory cell, n shift registers would be required. For example in a 4-bit memory, four shift registers are required.

The usage of the shift registers 260 and 262 is described in more detail as follows. The shift registers are used to serially hold good data for storage to the overhead sector of the memory row. Before a write to flash is started, the controller 210 generates a signal to preset the shifters to a value of all 1's. The controller then shifts in a 0 to the first bit of the shifters as a marker. The marker can be either a 1 or a 0. As each bad bit pair is loaded, the leading 0 is shifted down one bit location. At the end of the write operation, the bits are held in the shift register and ready for writing to Flash. Since the number of errors associated with each sector (row) being written can very, the controller aligns the defects so the location of the bad bits are known. The preloaded 0 is used for performing the alignment of the data before storage in Flash. The controller evaluates the most significant bit of the shifters to detect a zero. If no 0 is detected, the controller shifts a 1 into the shifter register forcing all the data to shift toward the MSB. Again, the controller evaluates the MSB looking for a zero. This process is repeated until a zero value is detected. When a zero is detected the controller shifts one more 1 into the shifter to force the data marker to fall out of the end of the shifter. At this point, the data is aligned and ready to be stored in a special back-up location in Flash. The controller then enables the shift registers to output data onto the write data bus and stores this data at a known location in Flash, associated with the sector being written. Below is an example of how the shifter is manipulated for storing data and achieving alignment.

| | |
|---|---|
| LSB 11111111 MSB | Shifter after Controller Preset |
| LSB 01111111 MSB | Shifter after marker Load |
| LSB 10111111 MSB | Shifter after bad bit 1 captured |
| LSB 01011111 MSB | Shifter after bad bit 0 loaded |
| LSB 00101111 MSB | Shifter after bad bit 0 loaded |

For this example, let us assume 3 bad bits (001) were present in the data sector sent to memory. At the end of this transfer the shifter would look like the last value shown above, provided the saved data matched the example capture bits used. At this point the controller would begin the alignment procedure by testing the MSB for a zero and shifting:

| | |
|---|---|
| LSB 10010111 MSB | Result after first test and shift |
| LSB 11001011 MSB | Result after second test and shift |
| LSB 11100101 MSB | Result after 3rd test and shift |
| LSB 11110010 MSB | Result after 4th test and shift |
| LSB 11111001 MSB | Ending result- test seen a zero then one extra shift given |

The data loaded into the shifters with this alignment is now ready to store in Flash with the data previously written. The controller sets enable signals that allow the data in the shifters to be gated onto the data bus and sent to Flash for storage. It is noted that the two bits are encoded for storage in one memory cell, and that the particular encoding is dependant upon the memory and can vary without effecting the present invention. Having stored this data, at some known address that allows for later recall, the defect management of a Flash Write is considered complete. Other events such as ECC storage and programming can be done as part of this overall operation. These operations very from product to product, but the overall method is well known and is not further described herein.

Flash Read

Once the Flash Data and Overhead, including the saved good data, have been written in flash, future accesses to this data requires read detect management to get the original data back in its proper order. The method for doing this is described as follows.

A read of a Flash data block is started by having the controller 210 load the defect pointers with the bad bit address locations that were used during the write operation. The pointers can be loaded from tables in Flash or can be loaded from tables resident in the controller 210, located in EPROM or EEPROM memory blocks. In either case the bad location pointers are loaded into the defect table 268 for use when reading. The controller then retrieves the good bits stored in the overhead locations and puts them in the shift register 260 and 262 that they were taken from when doing the write operation. This is done by doing a parallel load of the shift registers, with the data originally taken from them. Various other ways are possible but the fastest method is to load the shifters in a parallel load manner.

Once the pointers and good data bits are loaded, the controller starts a read operation for the sector of data covered by the bad location painters. The controller does this by sending the Flash memory the correct address and command for a read operation. The controller also sets the working address pointer to a clear state. With everything initialized in the Flash and defect management hardware, the DMA address is set and a start command is given. The controller hardware begins fetching data from Flash, gating it into the controller where it may be altered by the Modifier Logic 230 and then given to the defect management logic 228 for resubstitution of saved good bits back into their original locations in the data word. After the bits in a word/byte have been put back as originally sent, the data is loaded into holding buffer memory 220, at the same time it can be clocked into the ECC hardware logic. This procedure takes place until all bytes from Flash have been read from flash, modified, and defect locations substituted and sent to the buffer memory. After all these operations are completed, a sector of information should be resident in buffer memory and the ECC hardware will contain the resultant of its calculations. The controller then tests the ECC error bit to see if the data loaded into buffer memory contains any errors. If no errors are detected, the controller activates the host interface logic to send the data to the host via the standard handshake method for the interface used. If an error is found, the controller executes retry procedures and determines if the ECC error is correctable. If correctable, the controller alters the bit(s) in error and sends the data to the host in the standard manner.

Figure 8:
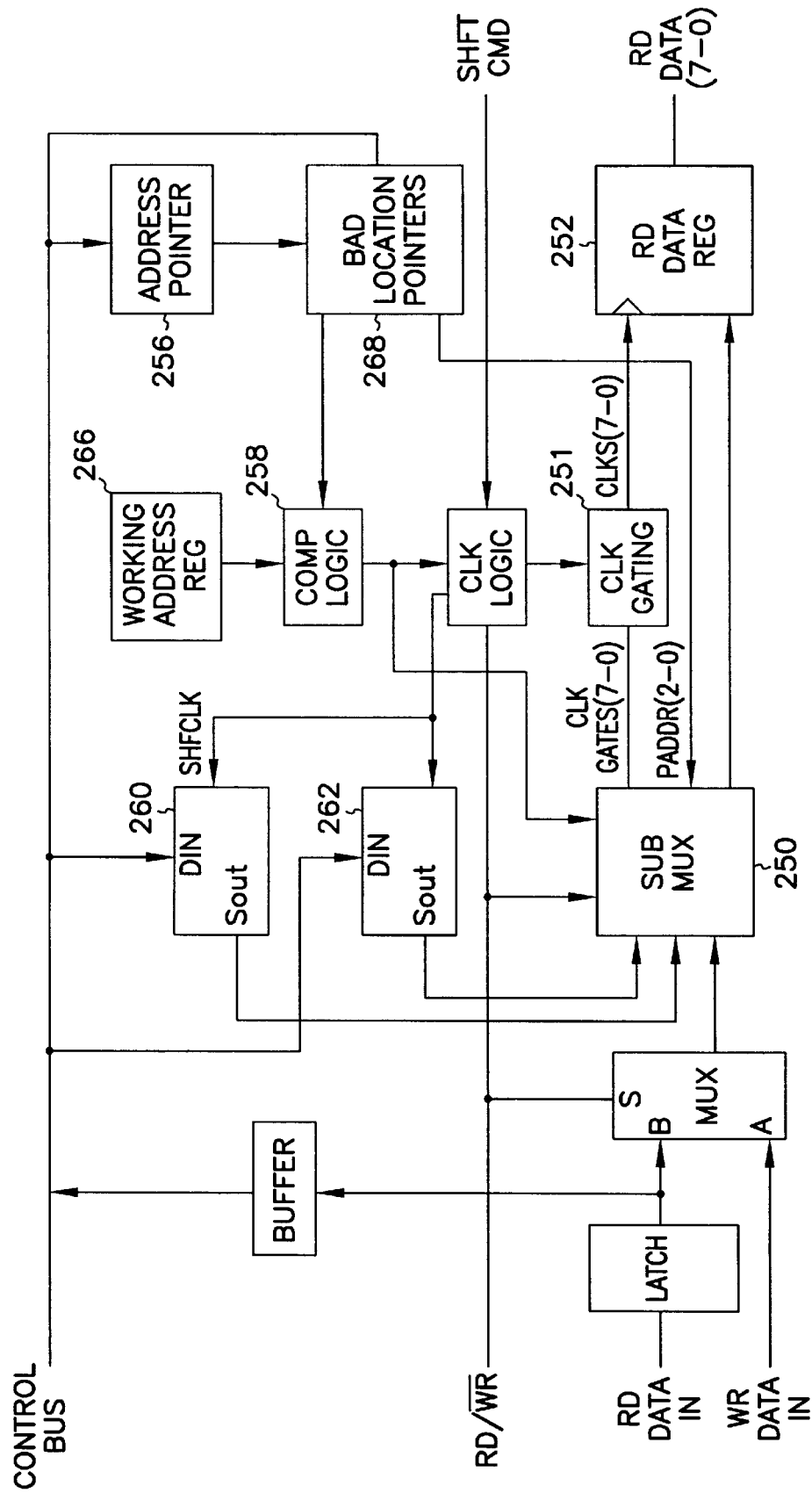
FIG. 8 is an alternate illustration of the defect management logic during at read operation.
Figure 9:
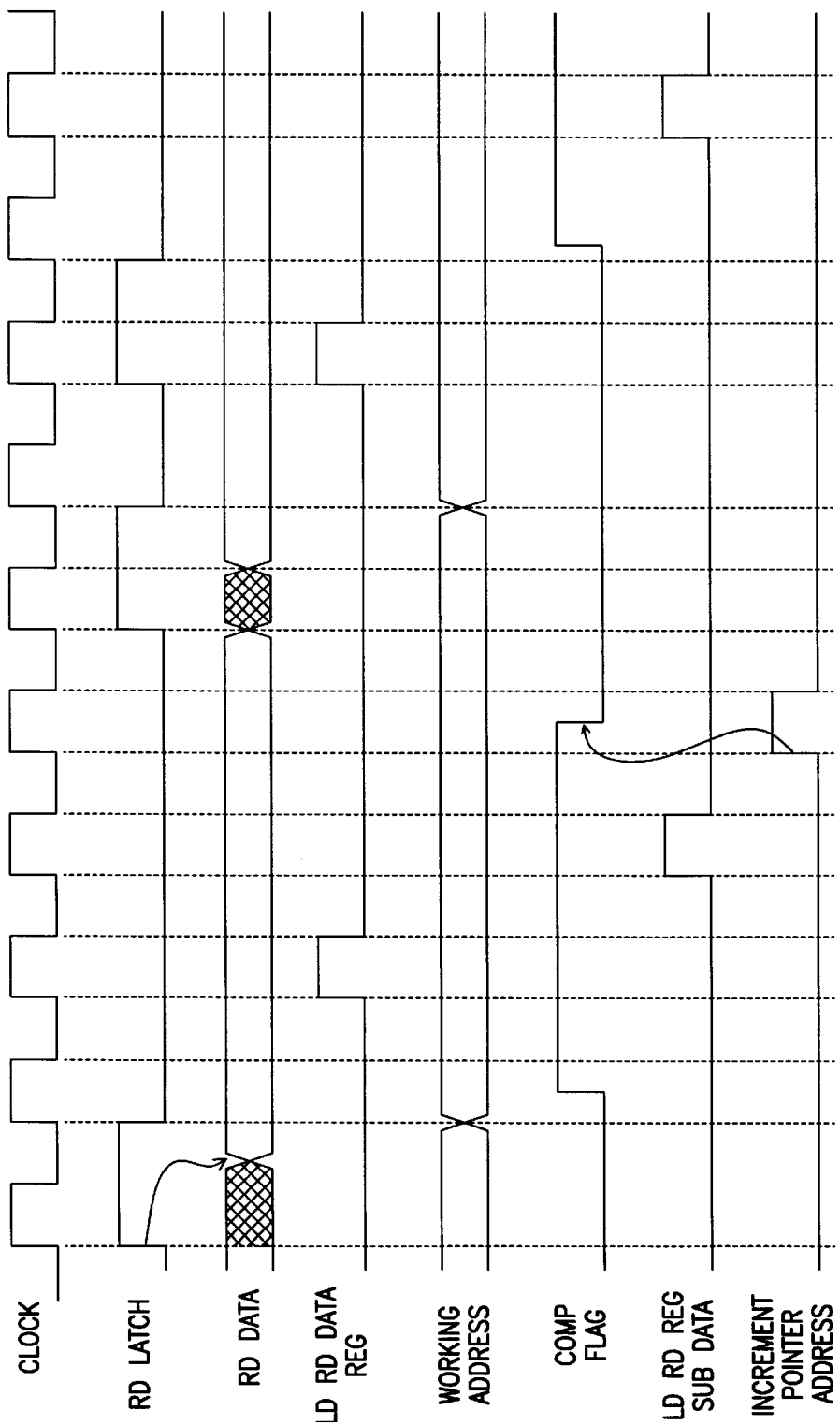
FIG. 9 is a timing diagram of the operation of the logic of FIG. 8.

Having briefly described the read operation, a more detailed explanation of the defect management logic 228 and its usage during reads is provided. FIG. 8 shows the hardware path for the Read Defect Management operation and FIG. 9 illustrates one example of a read timing operation. Most of the blocks shown in FIG. 8 are the same as those shown in FIG. 3, with the logic being duplicatly used in both the read and write modes to save overall controller logic. On reads, the data from the shift registers 260 and 262 is substituted back into the read data, where on writes the bits were taken from the data and put into the shifters. As data is shifted out of the memory the working address register is clocked to count each byte of data being read. This count represents the data address within the Flash memory device. When a location in flash has a defect, the counter address value matches the defect pointer and results in the bad location flag 258 going active. When this occurs the substitute multiplexer logic 250 is activated to substitute the bits from the shifter to the read data register 252. Special timing pulses are provided that clock the bad location registers. The clock circuitry 251 advances the address to the register file, fetching the next sequential bad location pointer. At the same time, a shift pulse is given to the shifters 260 and 262 making the next substitute bit available to the input of the multiplexer logic. If another match occurs then the corresponding locations in the read register are updated as the previous ones just described. If no flag is set after the next pointer fetch, then that byte in the read data register is determined to be correct. When the data is sent to the buffer 220 it is also presented to the input of the ECC logic, where it is clocked in. At the same time the next byte from memory is fetched and the working address is updated to reflect the address of the data being read. The compare and clocking sequence for this byte just fetched continues as before. This procedure continues until all bytes for that sector have been read from flash. At the end of the data read operation, the Check bits are gated through the controller to the ECC logic. After these bytes are clocked into the ECC the controller checks the ECC for error status and responds accordingly to the status of this flag.

Like the write operation, the read path is set up to allow normal two-state operation as an alternate method of storing data. This is done by multiplexing the even bits to the odd locations when the mode bit representing multi-state store is not set. This allows two-state data to be input into the shifters for both odd and even bits, and then later to restore these saved values on whichever register is being pointed to by the defect pointer.

The pointer value located after the last defect pointer should always be loaded with an address value outside the address window of the working address register to prevent false compares at the end of the read or write sequence. For example, if the last packet read with the present mass storage memory chip is packet number 10. A value such as 13 would be a safe value to load at this end location to prevent false compares.

Conclusion

The present invention stores data intended for defective memory cells in a row of a memory array in an overhead location of the memory row. The data is stored serially in the overhead packet during a write operation, and is read serially from the overhead packet during a read operation. A defect location table for the row of the memory array is used to identify when a defective memory cell is addressed for either a read or write access operation. During a write operation, the correct data is stripped from incoming data for storing into the overhead packet. During a read operation, the correct data is inserted into an output data stream from the overhead packet. To provide flexibility in reducing effects of defective memory cells, data written to defective cells can be manipulated to a specific state. That is, a memory cell which has a short circuit may be written to an erase state to reduce current during the writing operation, while a different type of defect may require a different storage state. A default setting, or the original data can also be used if the specific defect is not known or does not matter. Shift registers have been described for holding good data during a write operation for storing in the overhead location.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A processing system comprising
    a plurality of flash memory devices each having an array of memory cells arranged in rows and columns, each row of the array including overhead memory cells to store overhead data;
    a processor to control read and write operations for the plurality of flash memory devices;
    a defect table register to store a defect table including addresses of defective memory cells in the plurality of flash memory devices;
    a compare circuit to compare the defect table and an address of a memory location of one of the plurality of flash memory devices to determine if the memory location is defective;
    at least one shift register to serially hold input data intended to be written to defective memory locations; and
    memory interface logic to store contents of the at least one shift register in the overhead memory cells.

2. The processing system of claim 1, further comprising a read shift register to serially hold output data intended to read from the defective memory locations, such that the memory interface logic reads contents of the overhead memory cells and stores the contents in the read shift register.

3. The processing system of claim 1 wherein the at least one shift register is adapted to serially hold output data read from the defective memory locations, Such that the memory interface logic reads contents of the overhead memory cell and stores the contents in the at least one shift register.

4. The processing system of claim 1 wherein each of the memory cells in the plurality of flash memory devices store X-bits of data.

5. The processing system of claim 4 wherein the at least one shift register comprises X shift registers.

6. The processing system of claim 1 wherein the memory interface logic includes elements to store a marker in the at least one shift register for aligning data stored therein.

7. The processing system of claim 6 wherein the marker is a logic zero data bit.

8. The processing system of claim 1, further comprising substitution circuitry to replace the input data intended to be written to the defective memory locations with predetermined substitution data.

9. The processing system of claim 8 wherein the substitution circuitry comprises a multiplex circuit.

10. The processing system of claim 1 wherein each of the memory cells of the plurality of flash memory devices store n-bits of data and the at least one shift register comprises n shift registers.

11. The processing system of claim 1 wherein the defect table includes predetermined substitution data for replacing the input data intended to be written to the defective memory locations.

12. The processing system of claim 11 wherein the predetermined substitution data is encoded for n-state data storage.

13. The processing system of claim 1 wherein the defect table includes addresses of defective memory cells located in a single row.

14. The processing system of claim 1 wherein the defect table is stored in one of the plurality of flash memory devices for use by the defect table register.

15. A method of storing data in a flash memory device comprising an array of memory cells arranged in rows and columns, each row of the array having a data portion for storing data, and an overhead portion, the method comprising:
    identifying defective memory cells located in the data portion of a row;
    receiving a stream of data bits to be stored in the array of memory cells;
    selectively removing data bits from the data stream which are intended to be written to the defective memory cells; and
    serially storing the removed data bit in the overhead portion of the row.

16. The method of claim 15 wherein selectively removing data bits from the data stream further comprises holding the removed data bits in at least one shift register.

17. The method of claim 15 further comprising:
    storing a marker in at least one shift register; and
    storing the removed data bits in the at least one shift register and aligning the data bits with the marker.

18. The method of claim 17 wherein the marker is a logic zero data bit.

19. The method of claim 17, further comprising storing n-bits of the data bits in each memory cell in the array of memory cells.

20. The method of claim 15 further comprising:
replacing the removed data bits with substitution data bit; and
storing the stream of data bits including the substitution data bits in the array of memory cells.

21. The method of claim 15 further comprising:
creating a defect table comprising addresses of the defective memory cells.

22. The method of claim 21 wherein selectively removing data bits comprises:
comparing the addresses of the defective memory cells from the defect table with addresses of accessed memory cells; and
indicating when the compared addresses match.

23. The method of claim 21, further comprising adding substitution data to the defect table to replace the removed data bits.

24. A method of storing and retrieving data in a memory device, the method comprising:
receiving an input serial stream of data bits, and storing the input serial stream of data bits in a data location of the memory device wherein at least two of the data bits are stored in one memory cell;
selectively copying data bits from the input serial stream of data bits and storing the copied data bits in an overhead location of the memory device;
reading an output serial stream of data bits stored in the data location of the memory device;
reading the copied data bits from the overhead location of the memory device; and
selectively replacing data bits in the output serial stream of data bits to recreate the received input serial stream of data bits.

25. The method of claim 24, further comprising:
comparing an address of the data location of the memory device with addresses of known defective memory cells; and
identifying the data bits which are selectively copied.

26. The method of claim 24, further comprising placing the selectively copied data bits in a shift register prior to storing the copied data bits in the overhead location.

27. The method of claim 24, further comprising:
storing a marker in at least one shift register; and
storing the selectively copied data bits in the at least one shift register and aligning the data bits with the marker.

28. The method of claim 27 wherein storing a marker comprises storing a logic zero data bit in at least one shift register.

29. The method of claim 27 wherein;
receiving an input serial stream further comprises storing n bits of the data bits in each memory cell in which the data bits are stored; and
storing a marker comprises n makers respectively in n shift registers.

30. The method of claim 24 wherein;
wherein selectively copying further comprises placing the copied data bits in two shift registers prior to storing the copied data bits; and
receiving an input serial steam further comprises storing two bits of the data bits in each memory cell in which the data bits are stored.

31. The method of claim 24 wherein selectively replacing data bits further comprises replacing the data bits using a multiplex circuit.

32. A method of storing data in a memory device, the method comprising:
selecting a current access target location in the memory device;
comparing a table of known defective memory cell locations in the memory device to the current access target location in the memory device;
extracting data bits from a plurality of data bits to be stored in the current access target location in the memory device;
substituting alternate data bits for the extracted data bits;
storing the plurality of data bits including the alternate data bits in the current access target location; and
storing the extracted data bits in the memory device in a second location.

33. The method of claim 32, further comprising storing the alternate data bits in the table of known defective memory cell locations.

34. The method of claim 32 wherein substituting alternate data bits further comprises substituting the alternate data bits using a multiplex circuit.

35. The method of claim 32, further comprising holding the extracted data bits in at least one shift register prior to storing the extracted data bits in the memory device in a second location.

36. The method of claim 32, further comprising providing the alternate data bits from a controller.

37. A method of defect management in a memory device having a row of memory cells arranged in n-data packets including at least one overhead data packet, the method comprising:
identifying memory cells located in the n-data packets which are defective; and
rerouting data intended to be stored in the defective memory cells to be stored in the at least one overhead data packet.

38. The method of claim 37 wherein each data packet has 32 bytes of memory cells.

39. The method of claim 37 wherein each memory cell stores at least two data bits.

40. The method of claim 39 wherein rerouting data further comprises holding the data in two shift registers.

41. The method of claim 37 wherein rerouting data further comprises holding the data in at least one shift register.

42. A data management system comprising:
a controller to access memory locations in memory devices in response to externally provided commands;
a defect table register to store a defect table having a plurality of memory addresses of defective memory locations;
a comparator to compare addresses stored in the defect table to currently accessed memory addresses;
a plurality of shift registers to store data directed to the defective memory locations; and
substitution circuitry to selectively substitute data in place of the data stored in the shift registers.

43. The data management system of claim 42 wherein the substitution circuitry comprises a multiplex circuit coupled to the controller and a memory device interface.

44. The data management system of claim 42 wherein each of the memory locations stores X bits of data.

45. The data management system of claim 44 wherein the shift registers comprise X shift registers.

46. The data management system of claim 42 wherein the defect table comprises data to be substituted in place of the data stored in the shift registers.

47. The data management system of claim 42 wherein the memory devices comprise a plurality of flash memories.

48. The data management system of claim 42, further comprising a multiplex circuit coupled to the plurality of shift registers to route even and odd data bits to the plurality of shift registers.

49. A processing system comprising:
- a plurality of n-state flash memory devices each having an array of memory cells arranged in rows and columns, each row of each array including memory cells dedicated to storing overhead data;
- a processor to control read and write operations for the plurality of n-state flash memory devices;
- a defect table register to store a defect table containing addresses of defective memory cells in the plurality of n-state flash memory devices and to store replacement data;
- a compare circuit to compare the addresses of the defect table and an address of a memory location of one of the plurality of n-state flash memory devices to determine if the memory location is defective;
- n-shift registers to serially hold input data intended to be written to defective memory locations;
- substitution circuitry to substitute the replacement data from the defect table in place of the input data intended to be written to defective memory locations prior to writing the input data to one of the n-state flash memory devices; and memory interface logic to store contents of the n-shift registers in the memory cells dedicated to storing overhead data.

50. A processing system comprising:
- a flash memory device having an array of memory cells arranged in rows and columns, each row in the array including memory cells to store input data and overhead memory cells to store overhead data;
- a processor to control read and write operations for the flash memory device; and
- a remapping circuit coupled between the flash memory device and the processor to transfer data to and from the flash memory device, the remapping circuit comprising:
  - a register containing a defect table with addresses of defective memory cells in the flash memory device;
  - a compare circuit to compare the addresses in the defect table and an address of a selected memory cell in the flash memory device to determine if the selected memory cell is defective;
  - at least one shift register to hold input data intended to be written to the defective memory cells in the flash memory device; and
  - interface logic to write contents of the shift register to the overhead memory cells.

51. The processing system of claim 50 wherein the flash memory device comprises a plurality of flash memory devices coupled to the remapping circuit.

* * * * *

UNITED STATES PATENT AND TRADEMARK OFFICE
CERTIFICATE OF CORRECTION

PATENT NO. : 6,034,891
DATED : March 7, 2000
INVENTOR(S) : Robert D. Norman

It is certified that error appears in the above-identified patent and that said Letters Patent is hereby corrected as shown below:

Title page, Abstract line 7, delete "address;ed" and insert therefor --addressed--.
Title page, Abstract line 18, delete "ofdata" and insert therefor -- of data--.

Column 8,
Lines 62-63, delete "are not used for compare an address" and insert therefor -- are not used to compare an address--.

Column 9,
Line 48, delete "sits" and insert therefor --bits--.

Column 10,
Line 57, delete "very" and insert therefor --vary--.

Column 11,
Line 41, delete "very" and insert therefor --vary--.

Column 12,
Line 1, delete "painters" and insert therefor --pointers--.

Column 14,
Lines 2-3, delete "to read" and insert therefor --to be read--.
Line 9, delete "locations. Such that" and insert therefor--locations, such that--.
Line 10, delete "memory cell" and insert therefor --memory cells--.
Line 57, delete "bit" and insert there for --bits--.

UNITED STATES PATENT AND TRADEMARK OFFICE
CERTIFICATE OF CORRECTION

PATENT NO. : 6,034,891
DATED : March 7, 2000
INVENTOR(S) : Robert D. Norman

It is certified that error appears in the above-identified patent and that said Letters Patent is hereby corrected as shown below:

Column 15,
Line 5, delete "bit" and insert there for --bits--.
Line 55, delete ";" and insert therefor --:--.
Line 59, delete "n makers" and insert therefor --storing n markers--.
Line 61, delete ";" and insert therefor --:--.
Line 62, delete "wherein".
Line 65, delete "steam" and insert therefor --stream--.

Signed and Sealed this

Third Day of July, 2001

*Attest:*

NICHOLAS P. GODICI
*Attesting Officer*     *Acting Director of the United States Patent and Trademark Office*